United States Patent
Shim et al.

(10) Patent No.: US 7,518,224 B2
(45) Date of Patent: Apr. 14, 2009

(54) OFFSET INTEGRATED CIRCUIT PACKAGE-ON-PACKAGE STACKING SYSTEM

(75) Inventors: Il Kwon Shim, Singapore (SG); Byung Joon Han, Singapore (SG); Seng Guan Chow, Singapore (SG)

(73) Assignee: Stats Chippac Ltd., Singapore (SG)

( * ) Notice: Subject to any disclaimer, the term of this patent is extended or adjusted under 35 U.S.C. 154(b) by 186 days.

(21) Appl. No.: 11/383,403

(22) Filed: May 15, 2006

(65) Prior Publication Data

US 2007/0108581 A1 May 17, 2007

Related U.S. Application Data

(60) Provisional application No. 60/594,884, filed on May 16, 2005.

(51) Int. Cl.
*H01L 23/02* (2006.01)
*H01L 23/48* (2006.01)
*H01L 21/00* (2006.01)

(52) U.S. Cl. ............... 257/686; 257/E23.085; 257/E25.023; 257/E23.069; 257/E25.013; 257/685; 257/777; 257/723; 257/737; 257/778; 257/678

(58) Field of Classification Search ................ 257/686, 257/E23.085, E25.023, 737, 685, 777, 723, 257/778, 738, 773, 678, 687
See application file for complete search history.

(56) References Cited

U.S. PATENT DOCUMENTS

| | | | |
|---|---|---|---|
| 5,579,207 A | 11/1996 | Hayden et al. | |
| 5,748,452 A | 5/1998 | Londa | |
| 5,854,507 A | 12/1998 | Miremadi et al. | |
| 5,907,903 A | 6/1999 | Ameen et al. | |
| 5,963,430 A | 10/1999 | Londa | |
| 6,101,100 A | 8/2000 | Londa | |
| 6,239,496 B1 * | 5/2001 | Asada | 257/777 |
| 6,388,333 B1 * | 5/2002 | Taniguchi et al. | 257/777 |
| 6,410,983 B1 | 6/2002 | Moriizumi et al. | |
| 6,433,412 B2 | 8/2002 | Ando et al. | |
| 6,518,659 B1 | 2/2003 | Glenn | |
| 6,605,875 B2 * | 8/2003 | Eskildsen | 257/777 |
| 6,667,544 B1 | 12/2003 | Glenn | |
| 6,731,009 B1 * | 5/2004 | Jones et al. | 257/777 |
| 6,740,980 B2 * | 5/2004 | Hirose | 257/777 |
| 6,798,057 B2 | 9/2004 | Bolkin et al. | |
| 6,897,553 B2 | 5/2005 | King et al. | |
| 6,899,534 B2 | 5/2005 | Tandy | |
| 7,061,087 B2 * | 6/2006 | Kim | 257/686 |
| 7,075,188 B2 | 7/2006 | Kato et al. | |
| 7,087,989 B2 | 8/2006 | Nakayama | |
| 7,091,581 B1 | 8/2006 | McLellan et al. | |
| 7,095,104 B2 * | 8/2006 | Blackshear | 257/679 |
| 7,230,329 B2 | 6/2007 | Sawamoto et al. | |
| 7,312,519 B2 * | 12/2007 | Song et al. | 257/686 |
| 7,420,269 B2 * | 9/2008 | Ha et al. | 257/686 |
| 2004/0021230 A1 * | 2/2004 | Tsai et al. | 257/777 |

(Continued)

*Primary Examiner*—Alexander O Williams
(74) *Attorney, Agent, or Firm*—Mikio Ishimaru

(57) ABSTRACT

An offset integrated circuit package-on-package stacking system is provided including providing a base substrate, forming a contact pad on the base substrate, mounting a first integrated circuit on the base substrate, forming a base package body around the first integrated circuit, providing an offset substrate, mounting a second integrated circuit on the offset substrate, and coupling the offset substrate to the contact pad, including placing the offset substrate on the base package body.

20 Claims, 5 Drawing Sheets

U.S. PATENT DOCUMENTS

2004/0026789 A1* 2/2004 Michii .................. 257/777
2004/0036182 A1* 2/2004 Corisis et al. ............. 257/787
2004/0195700 A1   10/2004 Liu
2006/0139902 A1   6/2006 Happoya
2007/0241442 A1* 10/2007 Ha et al. ................. 257/686
2008/0029858 A1* 2/2008 Merilo et al. ............ 257/668
2008/0136006 A1* 6/2008 Jang et al. ............... 257/686
2008/0136007 A1* 6/2008 Kim et al. ............... 257/686

* cited by examiner

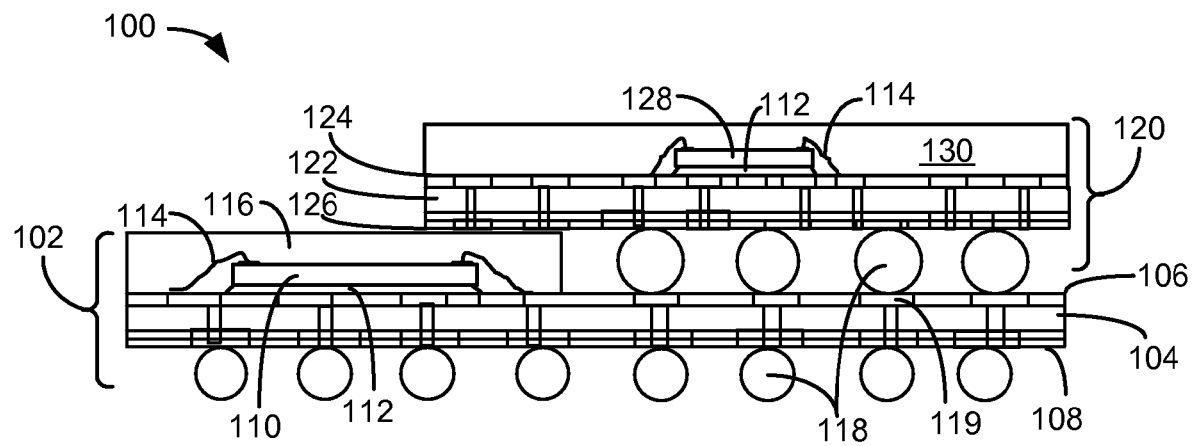
FIG. 1
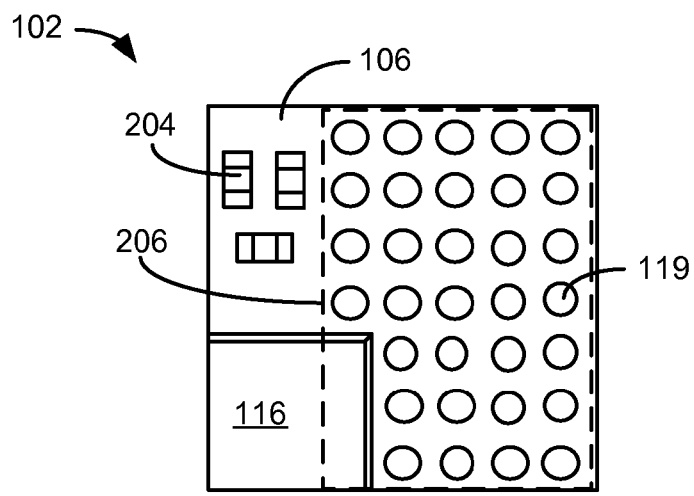
FIG. 2
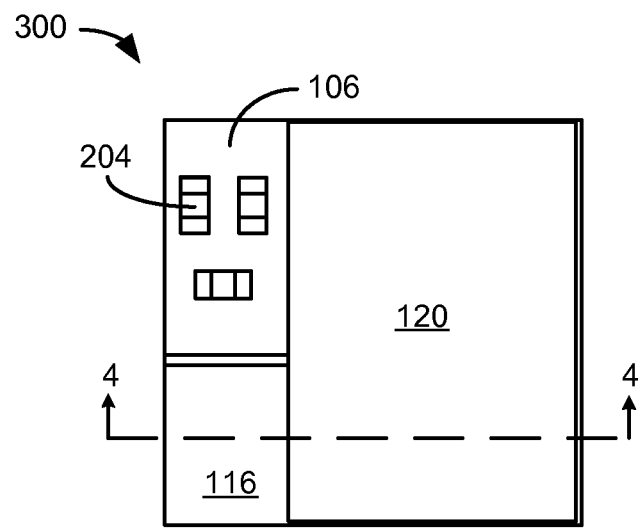

OFFSET INTEGRATED CIRCUIT PACKAGE-ON-PACKAGE STACKING SYSTEM

CROSS-REFERENCE TO RELATED APPLICATION(S)

This application claims the benefit of U.S. Provisional Patent Application Ser. No. 60/594,884 filed May 16, 2005.

The present application contains subject matter related to concurrently filed U.S. patent application Ser. No. 11/383,407 by Shim et al. entitled "Offset Integrated Circuit Package-on-Package Stacking System". The related application is assigned to STATS ChipPAC Ltd.

TECHNICAL FIELD

The present invention relates generally to integrated circuit package systems, and more particularly to a system for integrated circuit package systems having stacked packages.

BACKGROUND ART

In order to interface an integrated circuit with other circuitry, it is common to mount it on a lead frame or substrate. Each integrated circuit has bonding pads that are individually connected to the lead frame's lead finger pads using extremely fine gold or aluminum wires. The assemblies are then packaged by individually encapsulating them in molded plastic or ceramic bodies to create an integrated circuit package.

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as PC's, compute servers, and storage servers, need more integrated circuits in the same or smaller "real estate". Particularly acute, the needs for portable personal electronics, such as cell phones, digital cameras, music players, PDA's, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a PCB substrate onto which a set of separate integrated circuit components is directly attached. Such multi-chip packages have been found to increase integrated circuit density and miniaturization, improve signal propagation speed, reduce overall integrated circuit size and weight, improve performance, and lower costs--all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. Moreover the substrate and integrated circuit are often damaged during assembly or testing, complicating the manufacturing process and increasing costs. The vertically stacked integrated circuit problems can be greater than the benefits.

Thus, a need still remains for improved packaging methods, systems and designs. In view of the shrinking size of consumer electronics and the demand for more sophisticated functions in the restricted space, it is increasingly critical that answers be found to these problems. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an offset integrated circuit package-on-package stacking system including providing a base substrate, forming a contact pad on the base substrate, mounting a first integrated circuit on the base substrate, forming a base package body around the first integrated circuit, providing an offset substrate, mounting a second integrated circuit on the offset substrate, and coupling the offset substrate to the contact pad, including placing the offset substrate on the base package body.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 1 is a cross-sectional view of an offset integrated circuit package-on-package stacking system, in an embodiment of the present invention;

FIG. 2 is a top view of a base package for the offset integrated circuit package-on-package stacking system, in an embodiment of the present invention;

FIG. 3 is a top view of an assembled package of the offset integrated circuit package-on-package stacking system, in an embodiment of the present invention;

BEST MODE FOR CARRYING OUT THE INVENTION

Figure 4:
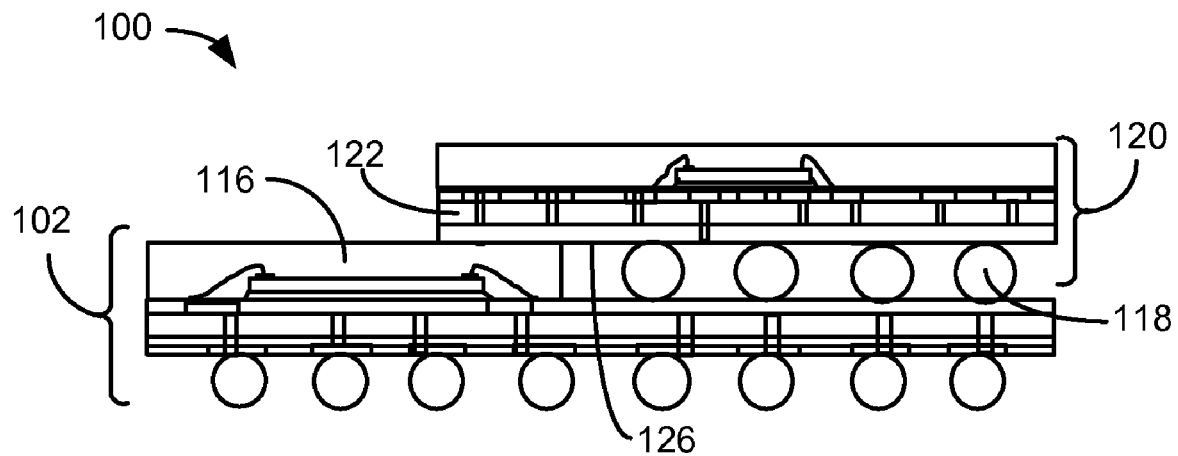
FIG. 4 is a cross-sectional view of the offset integrated circuit package-on-package stacking system, of FIG. 3 along section line 4-4.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the device are semi-diagrammatic and not to scale and, particularly, some of the dimensions are for the clarity of presentation and are shown greatly exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an offset integrated circuit package-on-package stacking system 100, in an embodiment of the present invention. The cross-sectional view of the offset integrated circuit package-on-package stacking system 100 depicts a base package 102, such as a ball grid array package, having a base substrate 104 with a base top surface 106 and a base bottom surface 108. A first integrated circuit 110 is mounted on the base top surface 106 with an adhesive 112, such as die attach material. The first integrated circuit 110 is coupled to the base top surface 106 by electrical interconnects 114, such as bond wires, solder bumps, solder columns or stud bumps. A base package body 116, such as molding compound, is injection molded around the first integrated circuit 110, the electrical interconnects 114 and a portion of the base top surface 106. System interconnects 118, such as solder balls, solder column interposers or stud bumps, are attached to the base bottom surface 108 for attachment to the next level of system (not shown). An array of a contact pad 119 is distributed in an area around the base package body 116.

An offset package 120, having an offset substrate 122 with a top surface 124 and a bottom surface 126, is mounted in an offset position on the base package 102. The offset package 120 has a second integrated circuit 128 mounted on the top surface 124 with the adhesive 112. The second integrated circuit 128 is coupled to the top surface 124 by the electrical interconnects 114. An offset package body 130, such as the molding compound, is injection molded over the second integrated circuit 128, the top surface 124 and the electrical interconnects 114. The system interconnects 118 are attached to the bottom surface 126, of the offset substrate 122. The offset package 120 is mounted on the base package 102, so that the bottom surface 126 of the offset substrate 122 rests on the base package body 116 and the system interconnects 118. This configuration reduces the space required on a printed circuit board (not shown), while maintaining a low profile over a portion of the offset integrated circuit package-on-package stacking system 100.

Referring now to FIG. 2, therein is shown a top view of the base package 102 for the offset integrated circuit package-on-package stacking system 100, in an embodiment of the present invention. The top view of the base package 102, of FIG. 1, depicts the base package body 116, of FIG. 1, on the base top surface 106, of FIG. 1, with an array of the contact pad 119, of FIG. 1, and a passive component 204. An outline 206 indicates the area that will be covered by the offset package 120, of FIG. 1. The outline 206 covers only a portion of the base package body 116 and leaves exposed, defined as specifically in the top view, a portion of the base substrate of FIG. 1. The array of the contact pad 119 is spaced to align with the system interconnects 118, of FIG. 1, of the offset package 120, of FIG. 1. The non-symmetrical array of the contact pad 119 allows the offset package 120 to extend over the base package body 116.

Referring now to FIG. 3, therein is shown a top view of an assembled package 300 of the offset integrated circuit package-on-package stacking system 100, in an embodiment of the present invention. The top view of the assembled package 300 depicts the base top surface 106 having the base package body 116, the passive component 204 and the offset package 120 mounted thereon. A section line 4-4 shows the position of the view in FIG. 4.

Referring now to FIG. 4, therein is shown a cross-sectional view of the offset integrated circuit package-on-package stacking system 100, of FIG. 3 along the section line 4-4. The cross-sectional view of the offset integrated circuit package-on-package stacking system 100 depicts the base package 102 with the offset package 120 mounted thereon. The bottom surface 126 of the offset substrate 122 is on the base package body 116. The base package body 116 supports the offset package 120 during the reflow process preventing collapse of the system interconnects 118.

Figure 5:
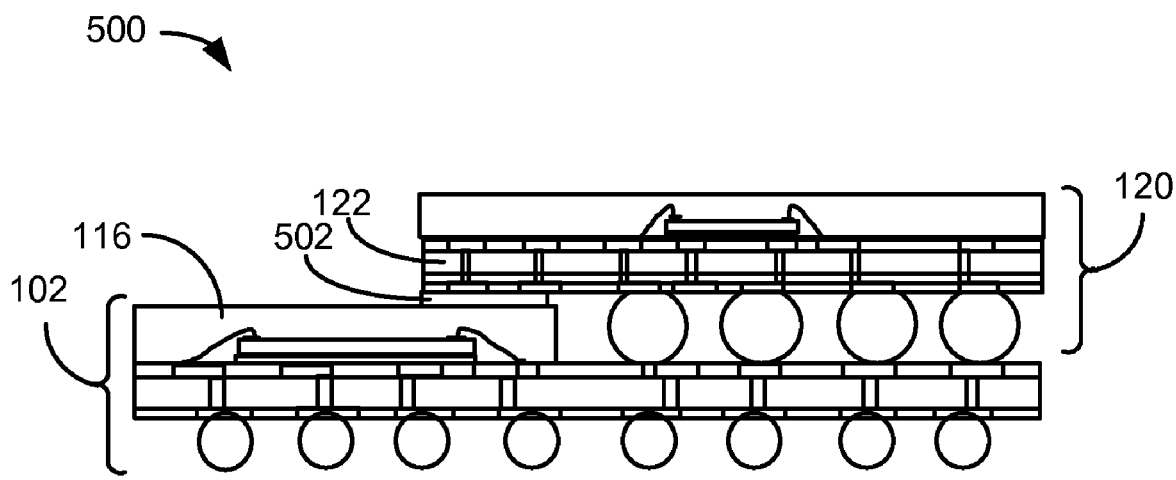
FIG. 5 is a cross-sectional view of the offset integrated circuit package-on-package stacking system, in an alternative embodiment of the present invention.

Referring now to FIG. 5, therein is shown a cross-sectional view of an offset integrated circuit package-on-package stacking system 500, in an alternative embodiment of the present invention. The cross-sectional view of the offset integrated circuit package-on-package stacking system 500 depicts the base package 102 having the offset package 120 coupled electrically through the system interconnects 118. A gap filler adhesive 502, such as die attach material or epoxy resin, is applied between the base package body 116 and the bottom surface 126 of the offset substrate 122. The application of the gap filler adhesive 502 provides additional mechanical stability to the package structure.

Figure 6:
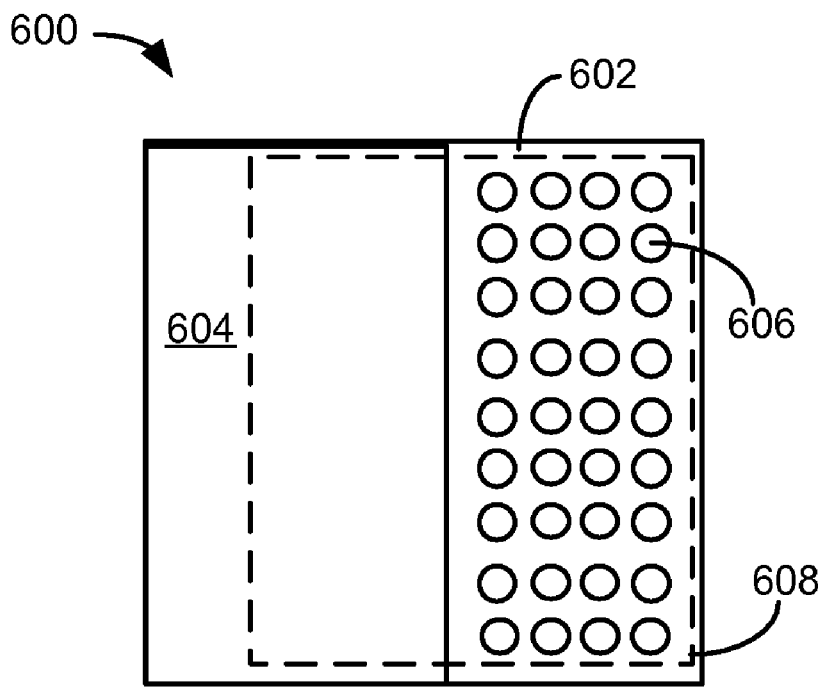
FIG. 6 is a top view of the base package for the offset integrated circuit package-on-package stacking system, in an alternative embodiment of the present invention.

Referring now to FIG. 6, therein is shown a top view of a base package 600 for the offset integrated circuit package-on-package stacking system 100, in an alternative embodiment of the present invention. The top view of the base package 600 depicts a base substrate top 602 having a base mold cap 604, an array of a system contact 606 and an outline 608, indicating the region that would be covered by the addition of the offset package 120, of FIG. 1.

Figure 7:
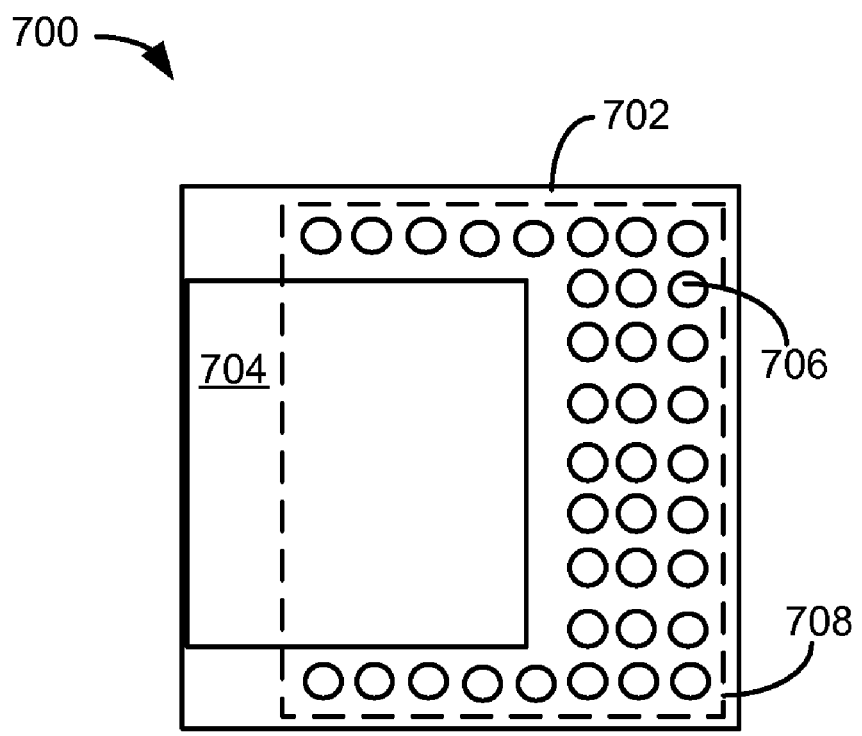
FIG. 7 is a top view of the base package for the offset integrated circuit package-on-package stacking system, in another alternative embodiment of the present invention.

Referring now to FIG. 7, therein is shown a top view of a base package 700 for the offset integrated circuit package-on-package stacking system 100, in another alternative embodiment of the present invention. The top view of the base package 700 depicts a base substrate top 702, having a base mold cap 704 an array of a contact pad 706, partially distributed around the base mold cap 704. An outline 708 indicates the region that would be covered by the addition of the offset package 120, of FIG. 1, should it be added. The array of the contact pad 706 provides an electrical interface between the base package 700 and the offset package 120.

Figure 8:
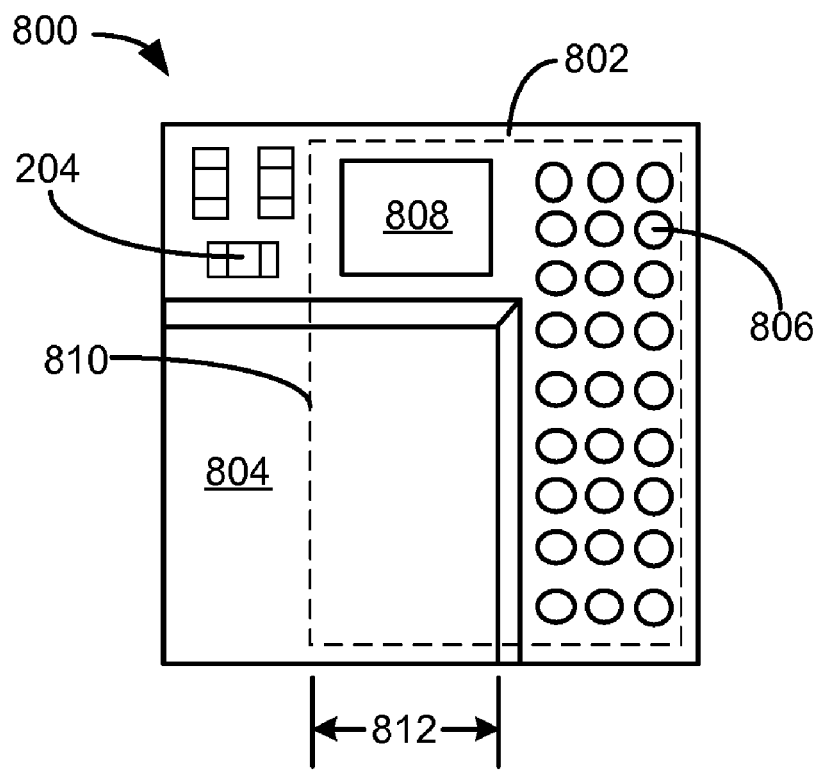
FIG. 8 is a top view of the base package for the offset integrated circuit package-on-package stacking system, in yet another alternative embodiment of the present invention.

Referring now to FIG. 8, therein is shown a top view of a base package 800 the offset integrated circuit package-on-package stacking system, in yet another alternative embodiment of the present invention. The top view of the base package 800 depicts a base substrate top 802 having a base mold cap 804, an array of a system contact pads 806, an active element 808, such as a flipchip integrated circuit, the passive component 204, and an offset package outline 810, indicating the region that would be covered by the addition of the offset package 120, of FIG. 1. An overlap region 812 indicates the contact area between the base mold cap 804 and the offset package 120. The corner of the base mold cap 804 will be covered by the offset package 120 which will rest on the base mold cap 804. The active element 808 is placed beneath the offset package 120 and does not contact the bottom surface 126, of FIG. 1, of the offset substrate 122, of FIG. 1.

Figure 9:
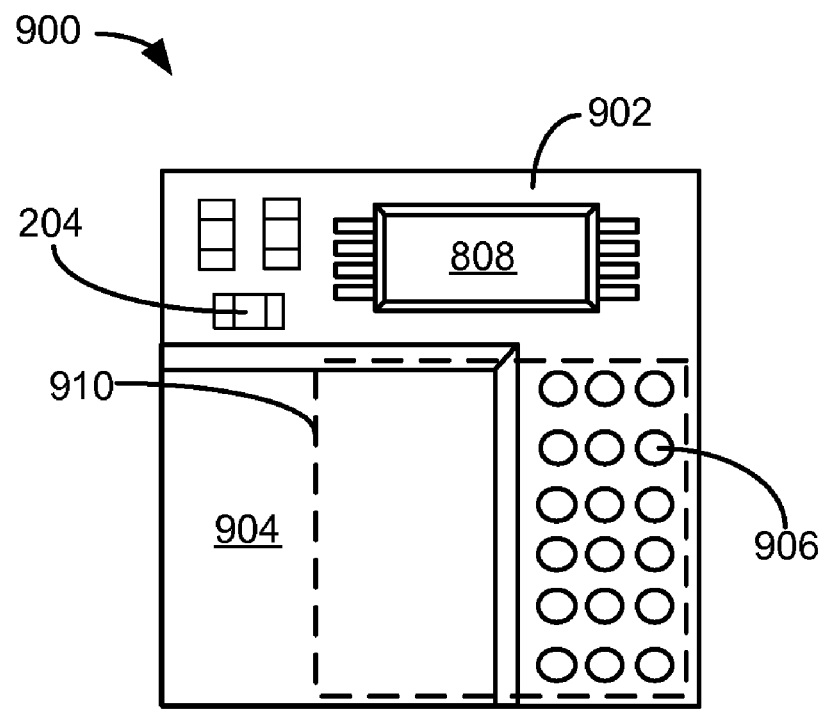
FIG. 9 is a top view of the base package for the offset integrated circuit package-on-package stacking system, in still another alternative embodiment of the present invention.
Figure 10:
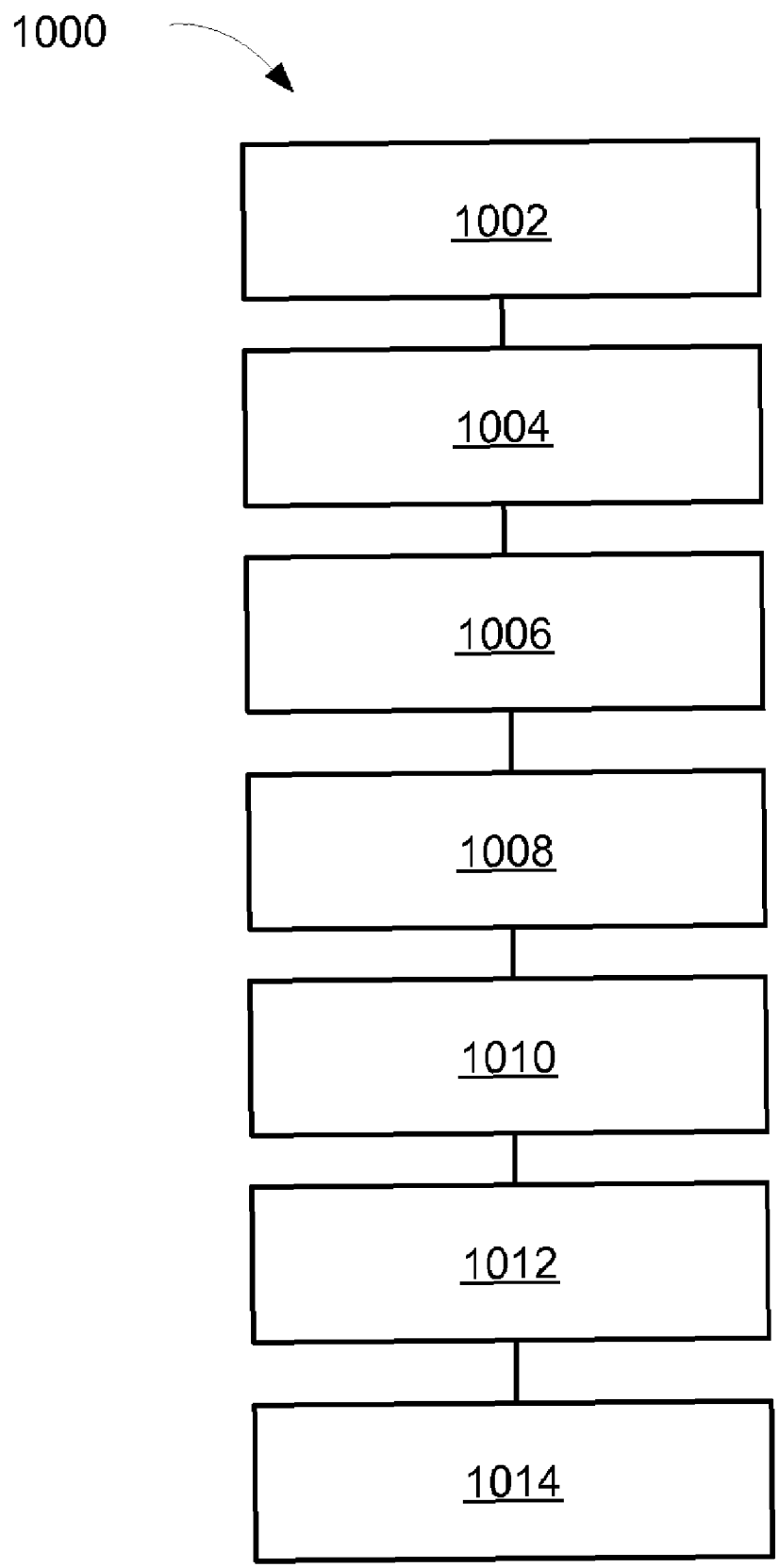
FIG. 10 is a flow chart of an offset integrated circuit package-on-package stacking system for manufacturing the offset integrated circuit package-on-package stacking system in an embodiment of the present invention.

Referring now to FIG. 9, therein is shown a top view of a base package 900 the offset integrated circuit package-on-package stacking system 100, in yet another alternative embodiment of the present invention. The top view of the base package 900 depicts a base substrate top 902 having a base mold cap 904, an array of a system contact pads 906, the active element 808, of FIG. 8, such as a small-outline integrated circuit, the passive component 204, and an offset package outline 910, indicating the region that would be covered by the addition of the offset package 120, of FIG. 1. The offset package 120 will rest on the base mold cap 904 with offset package aligned with the edge of the base mold cap. The active element 808 may be an active small-outline integrated circuit component that is electrically connected to the circuit within the base package 900, the array of the system contact pads, or a combination thereof Referring now to FIG. 10, therein is shown a flow chart of an offset integrated circuit package-on-package stacking system 1000 for manufacturing the offset integrated circuit package-on-package stacking system 100, in accordance with an embodiment of the present invention. The system 1000 includes providing a base substrate in a block 1002; forming a contact pad on the base substrate in a block 1004; mounting a first integrated circuit on the base substrate in a block 1006; forming a base package body around the first integrated circuit in a block 1008; providing an offset substrate in a block 1010; mounting a second integrated circuit on the offset substrate in a block 1012; and coupling the offset substrate to the contact pad, including placing the offset substrate on the base package body in a block 1014.

In greater detail, a system to manufacture an offset integrated circuit package-on-package stacking system, according to an embodiment of the present invention, is performed as follows:

1. Providing a base substrate having system interconnects. (FIG. 1)
2. Forming a contact pad on the base substrate. (FIG. 1)
3. Mounting a first integrated circuit on the base substrate, including coupling the first integrated circuit to the contact pad. (FIG. 1)
4. Forming a base package body around the first integrated circuit, including injecting a molding compound. (FIG. 1)
5. Providing an offset substrate including providing the system interconnects. (FIG. 1)
6. Mounting a second integrated circuit on the offset substrate including forming an offset package body over the second integrated circuit. (FIG. 1) and
7. Coupling the offset substrate to the contact pad, including placing the offset substrate on the base package body. (FIG. 1)

It has been discovered that the present invention thus has numerous aspects.

It has been discovered that in consumer electronic devices, where space is at a premium, the offset integrated circuit package-on-package stacking system can add more function in a limited space.

A principle aspect is that the present invention has the flexibility to add additional components on the base substrate without adding additional package size.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the offset integrated circuit package-on-package stacking system of the present invention furnishes important and heretofore unknown and unavailable solutions, capabilities, and functional aspects for increasing the integrated circuit density in consumer electronics that have diminished available space. The resulting processes and configurations are straightforward, cost-effective, uncomplicated, highly versatile and effective, can be implemented by adapting known technologies, and are thus readily suited for efficiently and economically manufacturing offset integrated circuit package-on-package stacked devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An offset integrated circuit package-on-package stacking system comprising:
   providing a base substrate;
   forming a contact pad on the base substrate;
   mounting a first integrated circuit on the base substrate;

forming a base package body around the first integrated circuit;

providing an offset substrate;

mounting a second integrated circuit on the offset substrate; and coupling the offset substrate to the contact pad, including placing the offset substrate over only a portion of the base package body to leave exposed a portion of the top of the base substrate.

2. The system as claimed in claim 1 further comprising mounting a passive component, an active component, or a combination thereof on the base substrate.

3. The system as claimed in claim 1 further comprising mounting an offset package on the base substrate with the offset package on the corner of a base mold cap.

4. The system as claimed in claim 1 further comprising providing a gap filler adhesive between the base package body and the offset substrate.

5. The system as claimed in claim 1 further comprising mounting an offset package on the base substrate with the offset package aligned with one edge of a base mold cap.

6. An offset integrated circuit package-on-package stacking system comprising:

providing a base substrate having system interconnects;

forming a contact pad on the base substrate;

mounting a first integrated circuit on the base substrate, including coupling the first integrated circuit to the contact pad;

forming a base package body around the first integrated circuit, including injecting a molding compound;

providing an offset substrate including providing the system interconnects, the offset substrate over only a portion of the base body package to leave exposed a portion of the top of the base substrate;

mounting a second integrated circuit on the offset substrate including forming an offset package body over the second integrated circuit; and coupling the offset substrate to the contact pad, including placing the offset substrate on the base package body.

7. The system as claimed in claim 6 further comprising mounting a passive component, an active component, or a combination thereof on the base substrate, including coupling the passive component, the active component, or the combination thereof to the first integrated circuit, or the contact pads.

8. The system as claimed in claim 6 further comprising mounting an offset package on the base substrate with the offset package on the corner of a base mold cap, including providing an overlap region.

9. The system as claimed in claim 6 further comprising providing a gap filler adhesive between the base package body and the offset substrate, including providing a die attach material.

10. The system as claimed in claim 6 further comprising mounting an offset package on the base substrate with the offset package aligned with one edge of a base mold cap under the offset substrate.

11. An offset integrated circuit package-on-package stacking system comprising:

a base substrate;

a contact pad formed on the base substrate;

a first integrated circuit mounted on the base substrate;

a base package body molded around the first integrated circuit;

an offset substrate;

a second integrated circuit mounted on the offset substrate; and the offset substrate coupled to the contact pad, includes the offset substrate placed over only a portion of the base package body to leave exposed a portion of the top of the base substrate.

12. The system as claimed in claim 11 further comprising a passive component, an active component, or a combination thereof mounted on the base substrate.

13. The system as claimed in claim 11 further comprising an offset package mounted on the base substrate with the offset package on the corner of a base mold cap.

14. The system as claimed in claim 11 further comprising a gap filler adhesive between the base package body and the offset substrate.

15. The system as claimed in claim 11 further comprising an offset package mounted on the base substrate with the offset package aligned with one edge of a base mold cap.

16. The system as claimed in claim 11 further comprising:

system interconnects on the base substrate;

the first integrated circuit coupled to the contact pad;

a molding compound injected around the first integrated circuit;

the system interconnects on the offset substrate; and an offset package body formed over the second integrated circuit.

17. The system as claimed in claim 16 further comprising a passive component, an active component, or a combination thereof mounted on the base substrate, includes the passive component, the active component, or the combination thereof coupled to the first integrated circuit, or the contact pads.

18. The system as claimed in claim 16 further comprising a base mold cap under the offset package mounted on the base substrate, with the offset package on the corner of the base mold cap, includes an overlap region.

19. The system as claimed in claim 16 further comprising a gap filler adhesive between the base package body and the offset substrate, comprises a die attach material.

20. The system as claimed in claim 16 further comprising a base mold cap under the offset package mounted on the base substrate with the offset package aligned with one edge of the base mold cap.

* * * * *

UNITED STATES PATENT AND TRADEMARK OFFICE
CERTIFICATE OF CORRECTION

PATENT NO.      : 7,518,224 B2
APPLICATION NO. : 11/383403
DATED           : April 14, 2009
INVENTOR(S)     : Shim et al.

It is certified that error appears in the above-identified patent and that said Letters Patent is hereby corrected as shown below:

Column 7, Claim 8, line 48, delete "comer" and insert therefor --corner--

In the drawings, Sheet 1 of 5, insert the label --FIG. 3-- below the figure as follows:

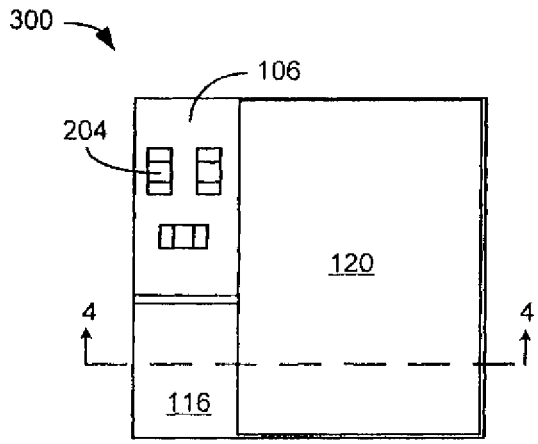

FIG. 3

Signed and Sealed this

Twenty-sixth Day of January, 2010

David J. Kappos
*Director of the United States Patent and Trademark Office*